US006614703B2

(12) United States Patent
Pitts et al.

(10) Patent No.: US 6,614,703 B2
(45) Date of Patent: Sep. 2, 2003

(54) METHOD AND SYSTEM FOR CONFIGURING INTEGRATED SYSTEMS ON A CHIP

(75) Inventors: Robert L. Pitts, Dallas, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 376 days.

(21) Appl. No.: 09/760,287

(22) Filed: Jan. 12, 2001

(65) Prior Publication Data

US 2001/0049174 A1 Dec. 6, 2001

Related U.S. Application Data

(60) Provisional application No. 60/175,972, filed on Jan. 13, 2000.

(51) Int. Cl.[7] .................................................. G11C 7/00
(52) U.S. Cl. ............. 365/221; 365/230.03; 365/185.08; 365/185.11; 365/189.12
(58) Field of Search ............................ 365/221, 185.08, 365/185.11, 189.12, 230.03

(56) References Cited

U.S. PATENT DOCUMENTS 5,758,056 A * 5/1998 Barr .............................. 714/7
6,411,561 B2 * 6/2002 Ayukawa et al. ...... 365/230.03

* cited by examiner

Primary Examiner—Son T. Dinh
(74) Attorney, Agent, or Firm—Ronald O. Neerings; Wade James Brady, III; Frederick J. Telecky, Jr.

(57) ABSTRACT

A method for configuring an integrated circuit chip having a non-volatile memory having a plurality of registers and a volatile memory includes, the method comprising: storing a plurality of configuration data in the non-volatile memory and, providing power to the volatile memory. After providing power to the volatile memory, serially loading the configuration data into the registers of the volatile memory to configure the semiconductor device.

20 Claims, 2 Drawing Sheets

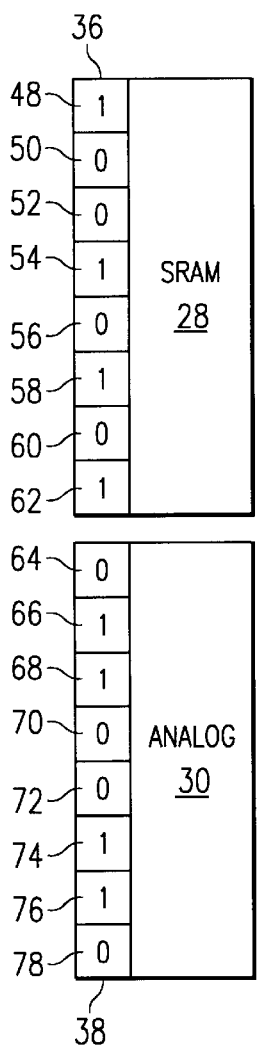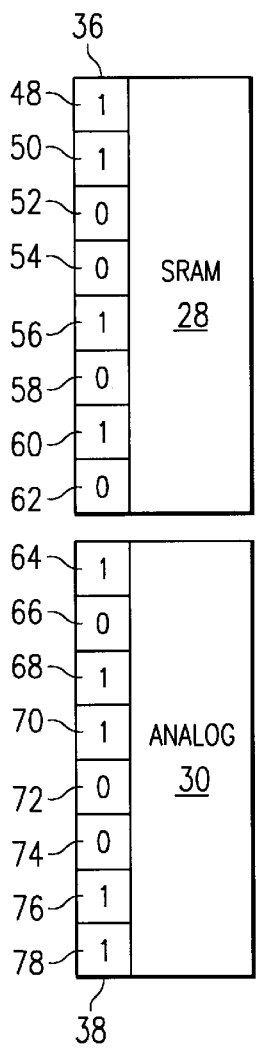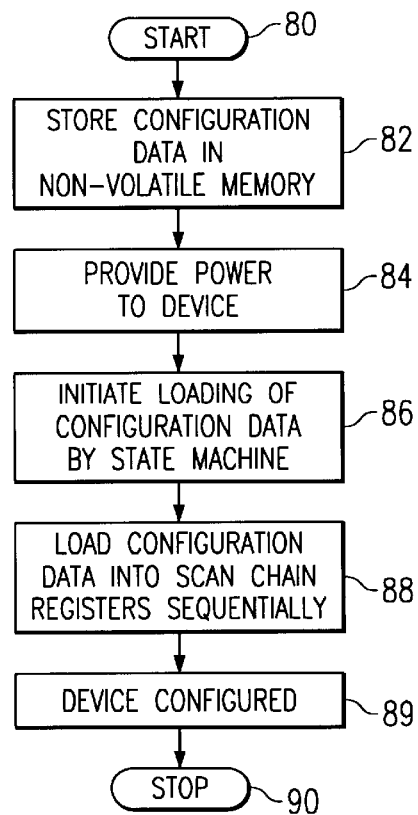
FIG. 4A   FIG. 4B
FIG. 5

METHOD AND SYSTEM FOR CONFIGURING INTEGRATED SYSTEMS ON A CHIP

This application claims priority under 35 USC §119(e)(1) of provisional application No. 60/175,972 filed Jan. 13, 2000.

TECHNICAL FIELD OF THE INVENTION

This invention relates generally to integrated systems on a chip and more particularly to a method and system for configuring integrated systems on a chip.

BACKGROUND OF THE INVENTION

Semiconductor devices on a chip, also referred to as integrated circuits, often utilize volatile memory. The state of volatile memory is lost when power is terminated. An example of a volatile memory is static random access memory (SRAM). Use of such memory may include storing configuration data. One example of configuration data is redundancy configuration designation data, which enable or disable extra rows and columns of volatile memory. Additional examples of the use of volatile memory for configuration purposes include the use of registers associated with analog circuits on an integrated circuit. For example, configuration bits are used to set gain parameters of an analog-to-digital converter to control the converter. Furthermore, trim bits may be provided to control operation of an analog circuit.

Because volatile memory "forgets" the stored information when power is terminated to the memory, a method is needed to store in this memory configuration information for an integrated circuit utilizing a volatile memory. This problem has been addressed by utilizing laser fuses for configuration purposes. In this process, a laser fuse is blown, which writes a "one" to the appropriate place in the volatile memory, configuring the integrated circuit. One problem with this type of configuration is that an extra mask step is required to fabricate the laser fuse into the integrated circuit. Laser fuses are also used to implement automated die identification for some devices.

Non-volatile memory does not lose its state when power is terminated to the memory. An example type of non-volatile memory is a flash memory. Flash memory implementation has utilized flash bits, or in other words, data stored in the non-volatile flash memory to program redundancy control circuits and implement die identification.

SUMMARY OF THE INVENTION

Accordingly, a need has arisen for an improved method and system for configuring integrated systems on a chip. The present invention provides a method and system for configuring integrated systems on a chip that address shortcomings of prior systems and methods. According to one embodiment of the invention, a method for configuring an integrated circuit chip having a non-volatile memory having a plurality of registers and a volatile memory, includes:

storing a plurality of configuration data in the non-volatile memory and providing power to the volatile memory. After providing power to the volatile memory, the configuration data are serially loaded into the registers of the volatile memory to configure the semiconductor device.

According to another embodiment of the invention, an integrated circuit device comprises a non-volatile memory for storing configuration data when the integrated circuit device is turned off and a volatile memory having a plurality of sequential registers. The integrated circuit device also comprises a state machine operable to control transfer of the configuration data to the volatile memory and a configuration interface connecting the flash memory to the state machine. The integrated circuit device also includes a data line connecting the state machine to at least one of the registers for transferring a portion of the configuration data from the state machine to the register and a clock line for transmitting a clock signal to cause a portion of the configuration data to be transferred from a first one of the plurality of registers to an adjacent register in the sequence.

Embodiments of the invention provide numerous technical advantages. For example, in one embodiment of the invention, configuration of an integrated circuit utilizing volatile memory, such as SRAM, is enabled without the use of laser fuses. In addition to avoiding the expense associated with laser fuses, it is not practical to configure an integrated circuit through the use of laser fuses in some implementations. Therefore, the teachings of the invention allow configuration in systems where traditional methods of configuration are not practical.

Embodiments of the invention may be utilized in suitable processes that have the capability of creating arrays of modifiable (one-time or many-time) non-volatile storage elements. For example, storage elements include flash, eeprom, laser fuses, and electrical fuses. Furthermore, according to the teachings of the invention, some of the types of non-volatile memory (e.g. flash, eeprom, and electrical fuses) allow redundancy mapping or analog trim capability at final task, enabling maximum yield. This is so because the configuration elements can be modified even in a package. This is desirable when packaging may cause yield blocks, which could be repaired with redundancy or trimming. Furthermore, SRAM and analog configuration do not require custom, process-specific, configuration bit capability.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIGS. 4A and 4B are enlarged drawings of the scan chain registers of portions of the integrated circuit of FIG. 2; and FIG. 5 is a flow chart illustrating a process for configuring an integrated circuit according to the teachings of the present invention.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1:
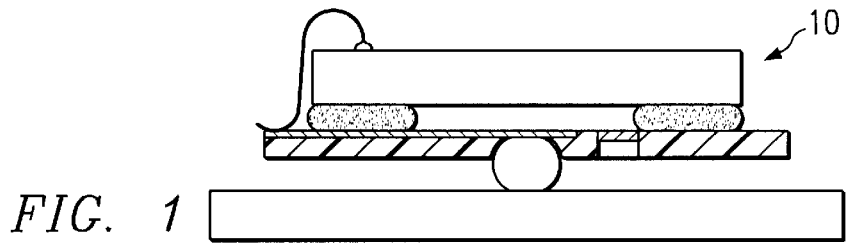
FIG. 1 is a schematic drawing of an integrated circuit according to the teachings of the present invention.
Figure 2:
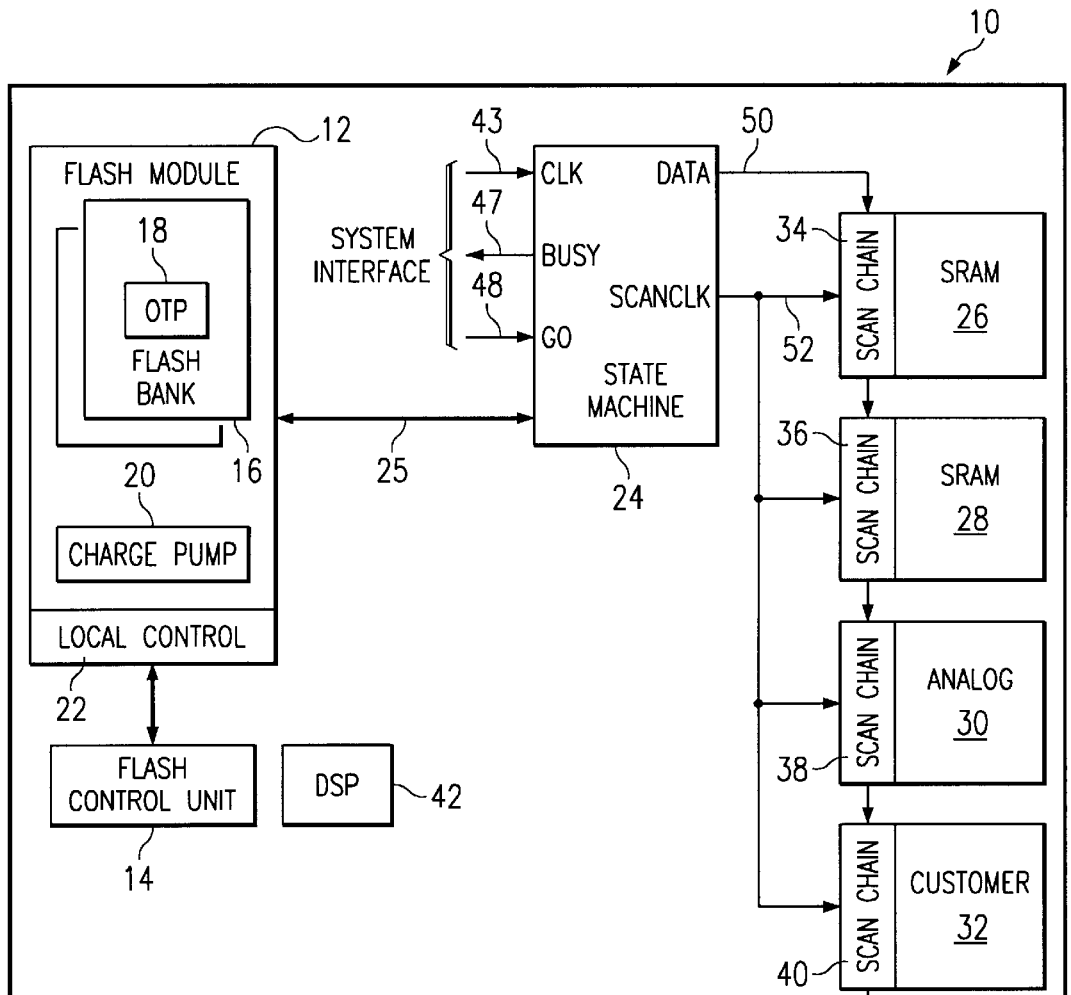
FIG. 2 is a block diagram of the integrated circuit of FIG. 1.

FIG. 1 is a schematic drawing of an integrated circuit 10 according to the teachings of the present invention, and FIG. 2 is a block diagram of integrated circuit 10. Integrated circuit 10 includes a flash memory module 12 coupled to a flash control unit 14. Flash memory module 12 includes a plurality of flash banks 16. Each flash bank 16 includes an array of flash memory cells. Flash memory is a specific type of non-volatile memory; therefore, flash memory cells maintain their state even when no power is supplied to the flash memory. In this embodiment, a non-erasable portion 18 of flash bank 16 is provided with each flash bank. Non-erasable portion 18 includes cells that may be programmed only, but not erased. Associated with the plurality of flash banks 16 is a charge pump 20. In this example, charge pump 20 includes voltage generators and associated control devices such as control logic, oscillators, and band gaps (not explicitly shown) for use with flash bank 16. Associated with flash module 12 is a local control unit 22. Local control unit 22 cooperates with flash control unit 14 to control operation of flash module 12.

Integrated circuit 10 also includes a state machine 24 coupled to a non-erasable portion 18 of flash module 12 by a configuration bit interface 25. State machine 24 controls loading of configuration data from non-erasable portion 18 to a plurality of additional portions of integrated circuit 10. These additional portions include static random access memory (SRAM) array 26, 28, analog circuitry 30, and a customer-specific circuitry 32. SRAM arrays 26, 28, analog circuitry 30, and customer specific circuitry 32 include volatile memory for storing configuration data. Integrated circuit 10 also includes a digital signal processor 42 that cooperates with the previously described units to perform a desired function.

Associated with SRAM array 26 is a scan chain 34. A scan chain is a well-known term for a plurality of sequential memory cells for receiving data sequentially. Scan chains 36, 38, and 40 are associated with SRAM array 28, analog circuitry 30, and customer-specific circuitry 32, respectively. According to the teachings of the invention, scan chains 34, 36, 38, and 40 receive a plurality of configuration bits for configuring the associated module (SRAM array 26, SRAM 28, analog circuitry 30, and customer-specific circuitry 32, respectively). Control circuitry (not expressly shown) may be used to configure the respective module based upon configuration data stored in the respective scan chain. Scan chains 36 and 38 are described in greater detail below in conjunction with FIGS. 4A and 4B.

According to the teachings of the invention, configuration data is stored in the non-volatile memory of flash module 12 and, upon providing power to integrated circuit 10, that configuration data is loaded serially into non-volatile memory within SRAM 26, 28, analog circuitry 30, and customer-specific circuitry 32 by state machine 24. Such a process avoids costly masking steps conventionally associated with using laser fuses for configuration. Furthermore, the teachings of the invention recognize the use of laser fuses in combination with a device having a flash memory is cost prohibitive due to the special requirements for protective oxides conventionally used with laser fuses to configure static random access memory. One reason configuration by laser fuses is not practical in devices utilizing both flash memory and SRAM, such as the example illustrated in FIG. 2, is that the use of laser fuses sometimes uses a protective oxide that allows ultraviolet light to pass, whereas flash memory does not accommodate such a protective oxide. Ultraviolet light is used in several important tests of the flash memory.

Additional details of state machine 24 are described as follows: State machine 24 includes a clock port 43 for receiving a clock signal for other portions of integrated circuit 10 (not explicitly shown). The received clock signal is used to generate a clock signed to control transfer of data from non-erasable portion 18 to state machine 24 over configuration bit interface 25. Transfer of data over configuration bit interface 25 is described in greater detail below. The clock signal received at clock port 43 is also used to generate a scan clock signal on line 52 for use in controlling transfer of data to scan chains 34, 36, 38, and 40. Data are transferred from state machine 24 to scan chains 34, 36, 38, and 40 over a data line 50 connected to state machine 24. State machine 24 also includes a "BUSY" port 47 to inform other portions of integrated circuit 10 that all data have been transferred into the volatile memory and that integrated circuit 10 has been configured. State machine 48 also includes a "GO" port 48 for receiving a signal from integrated circuit 10 to initiate transfer of data from non-erasable circuit 18 to scan chains 34, 36, 38 and 40. According to one embodiment, state machine 24 may be a fixed resistor-transistor logic design. It can be designed to read out a fixed number of bits, which it serializes. If less than the number of bits read need to be utilized to configure integrated circuit 10, then the additional bits may be discarded. Additional details of the embodiment of FIGS. 1 and 2 are described below in conjunction with FIGS. 3, 4A, 4B, and 5.

Figure 3:
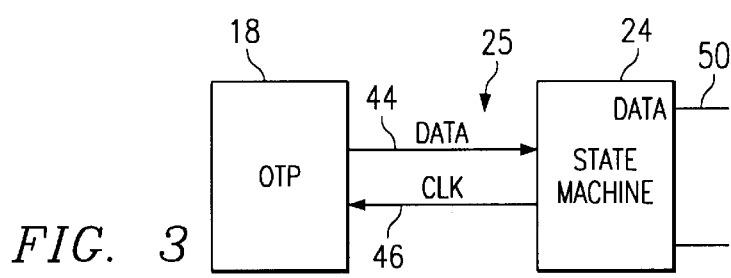
FIG. 3 is a block diagram showing the configuration bit interface illustrated in FIG. 2.

FIG. 3 is a block diagram showing one example of configuration bit interface 25. In this example, configuration bit interface 25 includes a data line 44 and a clock line 46. In response to receiving a clock signal along clock line 46 from state machine 24, data stored in non-erasable portion 18 of flash module 12 is transferred serially over data line 44 to state machine 24. The transferred data is then routed to the volatile memory by state machine 24, as described below.

FIGS. 4A and 4B are enlarged drawings of scan chain registers 36, 38 at consecutive time intervals. Scan chain 36 associated with SRAM array 28 may include a plurality of consecutive memory bits for storing configuration data. For simplicity of description, scan chain 36 is illustrated as having eight memory cells, 48, 50, 52, 54, 56, 58, 60, and 62; however, scan chain 36, as well as the other scan chains (34, 38, 40), may include any suitable number of memory cells. As illustrated in FIG. 4A, scan chain 38 associated with analog circuitry 30 also includes a plurality of memory cells 64, 66, 68, 70, 72, 74, 76 and 78. As demonstrated by FIGS. 4A and 4B, configuration data stored in the individual memory cells, are loaded sequentially into the memory cells. Thus, for example, the "1" contained in cell 48 in FIG. 4A is transferred to the next consecutive cell, memory cell 50 in FIG. 4B, during the next time interval. By sequentially loading configuration data in this manner, data may be loaded into memory cells for configuring the various modules with little additional circuitry. Scan chains 34, 36, 38, and 40 may be implemented with a multiplexer for allowing data from a test port to be provided to, or read from, the scan chain to provide additional testability or control.

FIG. 5 is a flow chart illustrating the process for configuring integrated circuit 10 according to the teachings of the present invention. The process of configuring integrated circuit 10 begins at step 80. At step 82, configuration data is stored in non-volatile memory. In the illustrated example, configuration data for SRAM arrays 26 and 28, analog circuitry 30, and customer-specific circuitry 32 are stored in non-erasable portion 18 of flash module 12. The configuration data are stored at appropriate locations within non-erasable regions 18 such that they may be read serially by state machine 26 for loading into modules 26, 28, 30, and 32.

Once power is supplied to integrated circuit 10 at step 84, non-volatile memory is ready to receive configuration data for configuring integrated circuit 10. At step 86, state machine 24 initiates loading of configuration data into scan chain registers 34, 36, 38 and 40. Such initiation may occur, for example, by writing a clock signal over clock line 46 to non-erasable portion 18. In response to the initiation of loading configuration data into the modules at step 86, configuration data are loaded serially into these modules. Loading of configuration occurs by state machine 24 transferring data received from non-erasable region 18 of flash module 12 to the scan chains 34, 36, 38 and 40. This process is effected through use of data line 50 and scan clock line 52. A clock signal on scan clock line 52 causes each scan chain to transfer configuration data from a current memory cell to a subsequent memory cell. Configuration data are provided from non-erasable portion 18 of flash module 12 over data line 44, associated with state machine 24. Therefore, by serially loading configuration data stored in flash module 12 into volatile memory, the integrated circuit 10 is configured at step 89. The process concludes at step 90.

In addition to storing configuration data in non-volatile memory for loading into volatile memory upon the powering up of integrated circuit 10, the teachings of the invention may be utilized for other purposes. For example, it is often desirable to provide an integrated circuit 10 with a die identification. This may be accomplished, for example, by storing a code identifying the record number, die lot ID number, die number, and several other identifications. This data may also be stored in non-volatile memory, such as flash module 12, for loading into volatile memory, such as SRAM array 26. The present invention also allows configuration bits to be stored on-chip, as opposed to off-chip systems, which is desirable.

In the described example, the present invention implements a cost-effective solution to the problem of configuring an integrated circuit by utilizing, in one example, a state machine with only two wires to implement a scan chain configuration for loading configuration data, thus providing an efficient means for configuring an integrated circuit upon power up.

Although the present invention and its advantages have been described in detail, it should be understood that various changes, substitutions, and alterations can be made therein without departing from the spirit and scope of the present invention as defined by the appended claims.

What is claimed is:

1. A method for configuring an integrated circuit chip having a non-volatile memory having a plurality of registers and a volatile memory, the method comprising:
   storing a plurality of configuration data in the non-volatile memory;
   providing power to the volatile memory; and
   after providing power to the volatile memory, serially loading the configuration data into the registers of the volatile memory to configure the semiconductor device.

2. The method of claim 1, wherein the volatile memory comprises static random access memory.

3. The method of claim 1, wherein the non-volatile memory comprises flash memory.

4. The method of claim 1, wherein serially loading the configuration data into the registers comprises serially loading, by a state machine, the configuration data into the registers.

5. The method of claim 1, wherein storing a plurality of configuration data comprises storing redundancy configuration data.

6. The method of claim 1, wherein storing configuration data comprises storing trim bits for controlling gain parameters of analog circuitry.

7. A method for configuring an integrated system on a chip having flash memory and static random access memory having a plurality of registers, the method comprising:
   storing configuration data in the flash memory;
   providing power to the state random access memory; and
   after providing power to the static random access memory, loading the configuration data serially, by a state machine, to the registers of the static random access memory, thereby configuring the integrated system.

8. The method of claim 7, wherein storing configuration data in the flash memory comprises storing static random access memory redundancy configuration data.

9. The method of claim 7, wherein storing configuration data in the flash memory comprises storing analog trim configuration data for controlling operation of analog circuitry on the integrated system.

10. The method of claim 7, wherein storing configuration data comprises storing customer-specific configuration data for configuring customer-implemented portions of the chip.

11. The method of claim 7, wherein loading configuration data serially, by the state machine, comprises transferring the configuration data to the state machine and serially transmitting the data to sequential registers in the static random access memory.

12. The method of claim 7, wherein loading the configuration data serially, by the state machine, comprises loading the configuration data by a state machine connected to the static random access memory by only two lines.

13. The method of claim 7, wherein loading the configuration data serially, by the state machine, to the registers comprises transmitting a clock signal from the state machine to the register to control propagation of configuration data from a first register of the static random access memory to a subsequent register of the static random access memory.

14. An integrated circuit device comprising:
   a non-volatile memory for storing configuration data when the integrated circuit device is turned off;
   a volatile memory having a plurality of sequential registers;
   a state machine operable to control transfer of the configuration data to the volatile memory;
   a configuration interface connecting the flash memory to the state machine;
   a data line connecting the state machine to at least one of the registers for transferring a portion of the configuration data from the state machine to the register; and
   a clock line for transmitting a clock signal to cause a portion of the configuration data to be transferred from a first one of the plurality of registers to an adjacent register in the sequence.

15. The device of claim 14, wherein the non-volatile memory comprises flash memory.

16. The device of claim 14, wherein the volatile memory comprises static random access memory.

17. The device of claim 14, wherein the non-volatile memory comprises memory calls for storing configuration data for controlling analog circuitry on the integrated circuit device.

18. The device of claim 14, wherein the non-volatile memory comprises memory cells for storing configuration data for controlling operation of customer-specific circuits on the integrated circuit device.

19. The device of claim 14, wherein the non-volatile memory comprises registers for configuring associated static random access memory on the integrated circuit device.

20. The device of claim 14, wherein the configuration interface comprises:

a data line for transferring the configuration data from the volatile memory to the state machine; and a control line for controlling transfer of the configuration data from the non-volatile memory to the state machine.

* * * * *